United States Patent
Gusev et al.

(10) Patent No.: US 10,282,251 B2
(45) Date of Patent: May 7, 2019

(54) SYSTEM AND METHOD FOR PROTECTING FIRMWARE INTEGRITY IN A MULTI-PROCESSOR NON-VOLATILE MEMORY SYSTEM

(71) Applicant: SanDisk Technologies LLC, Plano, TX (US)

(72) Inventors: Ilya Gusev, Gedera (IL); Yevgeny Zagalsky, Kfar Saba (IL); Beniamin Kantor, Ganey Tikva (IL); Shay Benisty, Beer Sheva (IL); Judah Gamliel Hahn, Ofra (IL)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/258,688

(22) Filed: Sep. 7, 2016

(65) Prior Publication Data

US 2018/0067800 A1    Mar. 8, 2018

(51) Int. Cl.

| | |
|---|---|
| *G11C 29/00* | (2006.01) |
| *G06F 11/10* | (2006.01) |
| *G11C 29/52* | (2006.01) |
| *G06F 3/06* | (2006.01) |
| *G06F 9/46* | (2006.01) |

(52) U.S. Cl.
CPC .......... *G06F 11/1068* (2013.01); *G06F 3/064* (2013.01); *G06F 3/0619* (2013.01); *G06F 3/0647* (2013.01); *G06F 3/0685* (2013.01); *G06F 9/46* (2013.01); *G06F 11/106* (2013.01); *G11C 29/52* (2013.01)

(58) Field of Classification Search
None
See application file for complete search history.

(56) References Cited

U.S. PATENT DOCUMENTS

| | | |
|---|---|---|
| 6,131,113 A | 10/2000 | Ellsworth et al. |
| 7,664,928 B1 | 2/2010 | Andrews et al. |
| 9,274,861 B1 | 3/2016 | Karppanen |
| 2005/0188129 A1 | 8/2005 | Abdelilah et al. |
| 2009/0125790 A1* | 5/2009 | Iyer ............ G06F 11/1068 714/773 |
| 2010/0070730 A1 | 3/2010 | Pop et al. |
| 2010/0241838 A1 | 9/2010 | Cohen et al. |
| 2012/0173953 A1* | 7/2012 | Flynn ............ G06F 8/665 714/758 |
| 2012/0265945 A1 | 10/2012 | Miyasaka |
| 2014/0244985 A1 | 8/2014 | Swanberg |

(Continued)

OTHER PUBLICATIONS

International Search Report and Written Opinion for corresponding application No. PCT/US2017/031983 dated Oct. 18, 2017.

*Primary Examiner* — Mujtaba M Chaudry
(74) *Attorney, Agent, or Firm* — Loza & Loza, LLP; Gabriel Fitch

(57) ABSTRACT

A system and method is disclosed for managing firmware in a non-volatile memory system having a multi-processor controller. The controller may be configured with a plurality of processors. Each of the plurality of processors may retrieve and check the integrity of firmware for a respective one of the other processors while the processor engaged in checking the respective one of the other processors is in an idle state.

19 Claims, 7 Drawing Sheets

(56) References Cited

U.S. PATENT DOCUMENTS

| | | | |
|---|---|---|---|
| 2015/0113355 A1* | 4/2015 | Kang | G06F 11/1048 714/764 |
| 2015/0154132 A1 | 6/2015 | Tuers et al. | |
| 2015/0169384 A1 | 6/2015 | Srinivas et al. | |
| 2015/0205646 A1 | 7/2015 | Singh | |
| 2016/0005495 A1 | 1/2016 | Lasser | |
| 2016/0034345 A1* | 2/2016 | Royer, Jr. | G06F 11/1048 714/766 |
| 2016/0080491 A1 | 3/2016 | Sykes et al. | |
| 2016/0140007 A1* | 5/2016 | Cho | G06F 11/2205 714/42 |
| 2017/0123696 A1 | 5/2017 | Kelner et al. | |

* cited by examiner

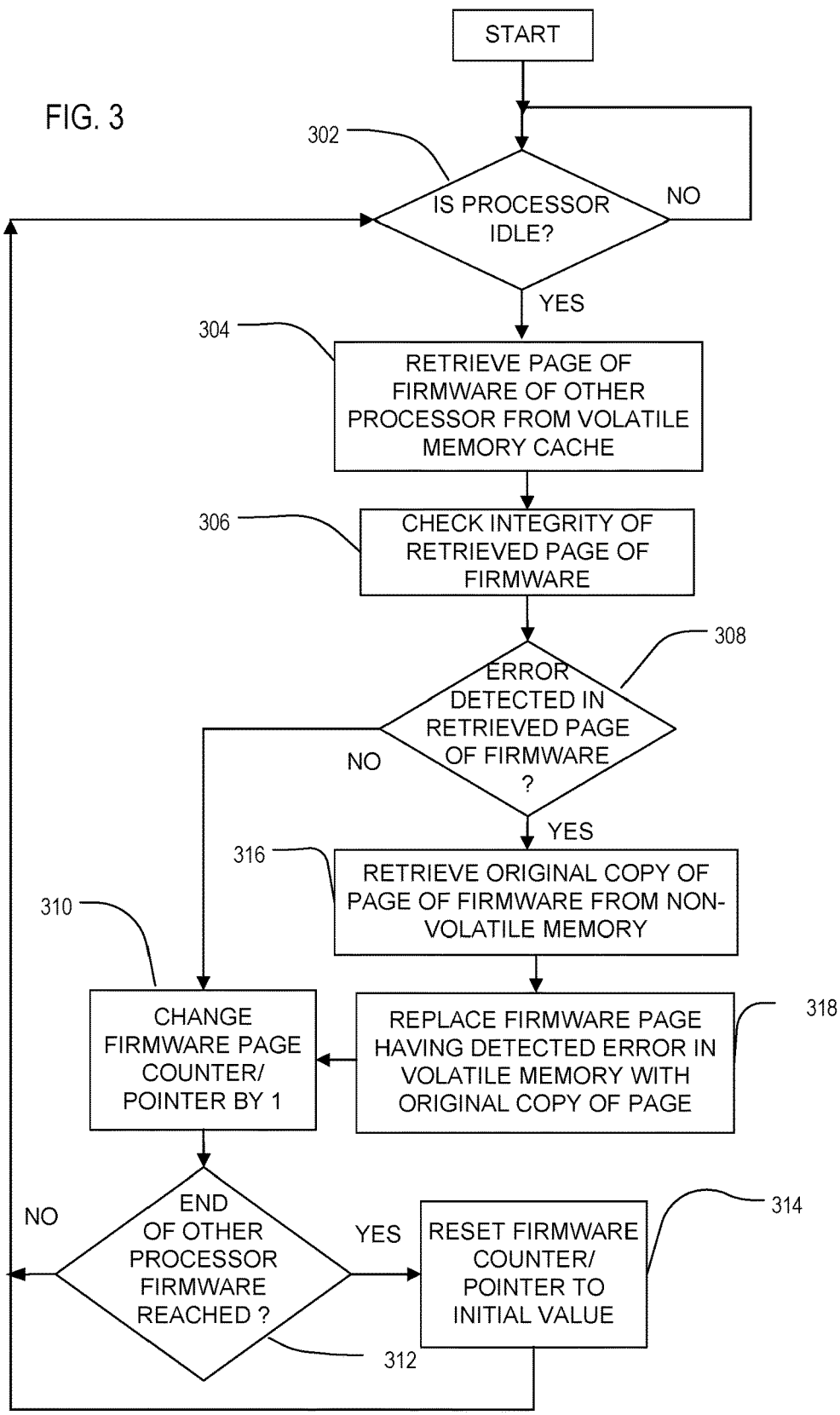

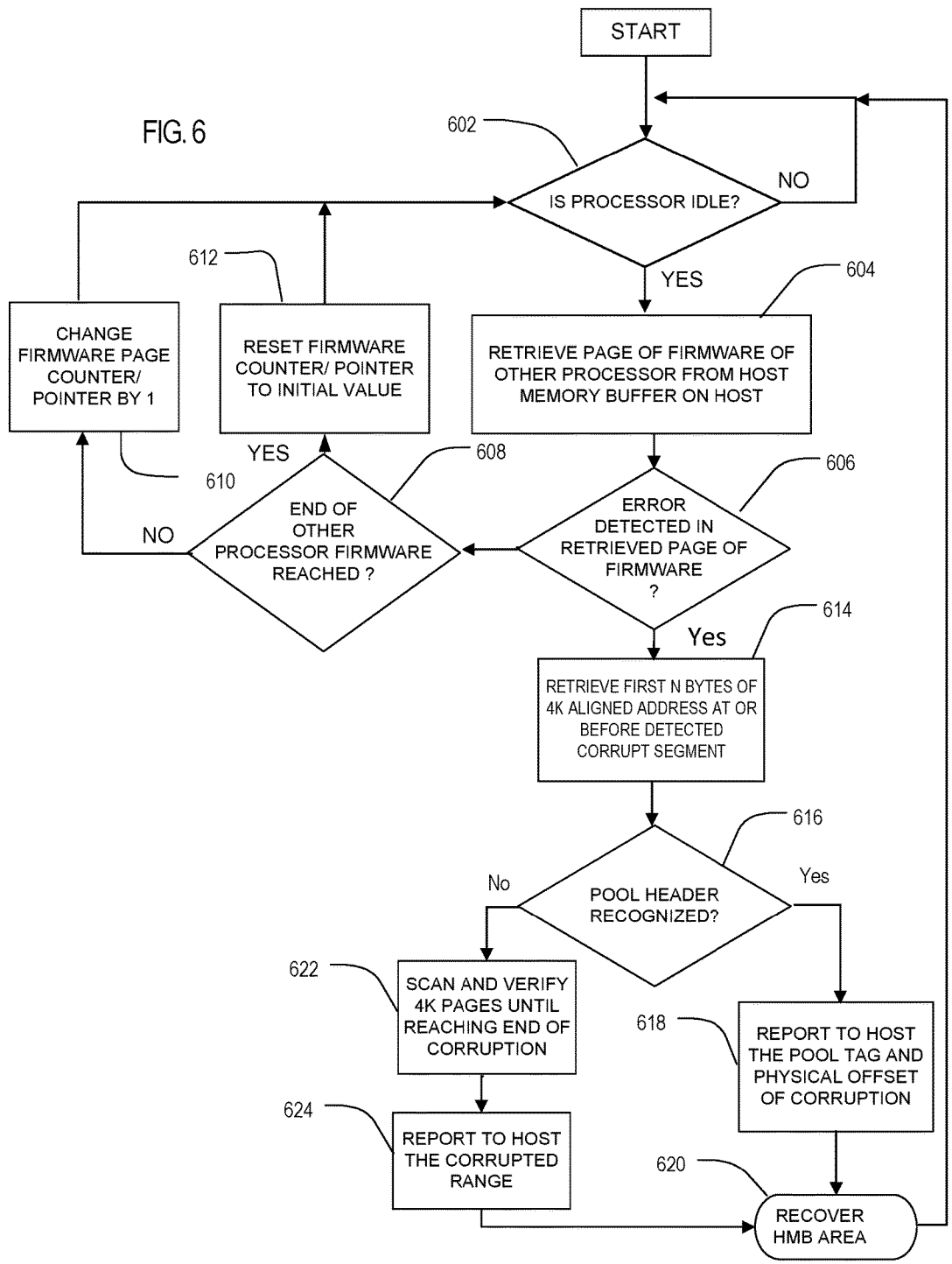

SYSTEM AND METHOD FOR PROTECTING FIRMWARE INTEGRITY IN A MULTI-PROCESSOR NON-VOLATILE MEMORY SYSTEM

BACKGROUND

Non-volatile memory systems, such as solid state drives (SSDs) including NAND flash memory, are commonly used in electronic systems ranging from consumer products to enterprise-level computer systems. Controllers in some SSDs often manage high throughput data traffic between one or more hosts and the multiple non-volatile memory die in the SSD. The high throughput combined with larger numbers of non-volatile memory die can result in processing demands in the SSD that lead to the need for a multi-processor controller.

Additionally, modern high-performance storage devices such as the SSDs mentioned above often include a volatile dynamic random access memory (DRAM) cache used to store address tables, executable firmware code, and other data. This cache is often susceptible to bit flips, and as such needs protection. One approach for handling bit flips in data is to provide end to end error protection for any type of data that is read from or written to DRAM. The end to end protection includes specialty hardware positioned in the data path that can detect and correct errors in real time. In some memory controller architectures, the specialty hardware, sometimes referred to as an error correction code (ECC) engine, may not be included in the data path used to access and store processor firmware.

BRIEF DESCRIPTION OF THE DRAWINGS

FIG. 3 is flow diagram illustrating a method of checking integrity of firmware in the non-volatile memory system of FIGS. 2A-2B.

FIG. 6 illustrates an alternative embodiment of the method of FIG. 3 where the cached version of the firmware is maintained in a host memory buffer outside of the non-volatile memory system.

DETAILED DESCRIPTION

Figure 1A:
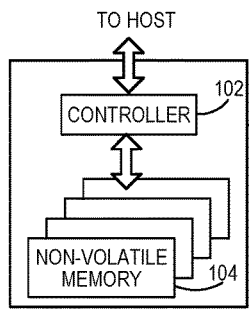
FIG. 1A is a block diagram of an example non-volatile memory system.

A system and method for protecting firmware in a multi-processor non-volatile memory system is disclosed that can correct for bit flips in a cache version of the firmware used to operate the multiple processors of the memory system. The disclosed system and method do not utilize a dedicated ECC engine that includes hardware positioned in the data path between the cache and the processors of the memory system that can identify and/or correct firmware retrieved from the cache in real time. Instead, the disclosed method and system utilize a first processor of a multi-processor controller to retrieve firmware of a second processor of the multi-processor controller to review the cache and check the integrity of the firmware of the second processor, and vice-versa.

As described in more detail below, when a processor in the multi-processor non-volatile memory system acts on a host command and retrieves its firmware from a volatile memory cache for execution, there is no real-time error correction or other integrity check before execution. Instead, the processor executes its retrieved firmware and, only when that processor is idle will it begin sequentially retrieving another processor's firmware from the cache and verifying the integrity of the firmware of that other processor. The process may be scaled for two or more processors, although the examples that follow are primarily a two processor system for ease of illustration.

According to one aspect, a method is disclosed for managing transient errors in firmware in a multi-processor non-volatile memory (NVM) system. The method may include, in response to detecting an idle state of a first processor in the NVM system, the first processor retrieving executable instructions of a second processor in the NVM system that are stored in the volatile memory during the idle state. The first processor may then verify the integrity of the retrieved executable instructions of the second processor during the idle state. In one implementation, the executable instructions of the second processor may include a plurality of predetermined portions and the first processor retrieving and verifying the integrity of the retrieved executable instructions of the second processor may include the first processor sequentially retrieving a respective one of the plurality of portions and verifying the integrity of the respective one of the plurality of portions before retrieving and verifying a next respective one of the plurality of portions.

Additionally, the method may further include the first processor storing corrected executable instructions of the second processor in the volatile memory in response to detecting an error in the retrieved executable instructions of the second processor. In one implementation, the first processor storing corrected executable instructions of the first processor in the volatile memory may include the first processor retrieving original executable instructions of the second processor from a non-volatile memory in the NVM system and replacing the executable instructions of the second processor in the volatile memory with the original executable instructions of the second processor. Alternatively, the first processor verifying integrity of the retrieved executable instructions of the second processor may include the first processor generating a checksum value for the retrieved executable instructions of the second processor and determining whether the generated checksum information matches previously stored checksum information associated with the retrieved executable instructions.

According to another aspect of the invention, a multi-processor non-volatile memory (NVM) system includes a non-volatile memory having a plurality of non-volatile memory cells, a first processor in communication with the non-volatile memory and a second processor in communication with the non-volatile memory. The NVM system also includes a volatile memory configured to hold executable instructions of the first processor in a first portion of the volatile memory and configured to hold executable instructions of the second processor in the first portion of the volatile memory. The first processor, only during an idle state of the first processor, is configured to check for errors in the executable instructions of the second processor in the first portion of the volatile memory. The second processor, only during an idle state of the second processor, is configured to check for errors in the executable instructions of the first processor in the first portion of the volatile memory.

In yet another aspect, a method is disclosed for managing errors in processor executable code stored in a volatile memory of a multi-processor non-volatile memory (NVM) system. The method may include, when a first processor of the multi-processor NVM system is operating on a host command, the first processor retrieving and executing executable code of the first processor from the volatile memory without first checking the executable code of the first processor for errors. The method also includes, when a second processor of the multi-processor NVM system is operating on a host command, the second processor retrieving and executing executable code of the second processor from the volatile memory without first checking the executable code of the second processor for errors. Furthermore, the method includes, only while the first processor is in an idle state, the first processor retrieving the executable code for the second processor from the volatile memory and checking the executable code of the second processor for errors. Similarly, the method includes, only while the second processor is in an idle state, the second processor retrieving the executable code for the first processor from the volatile memory and checking the executable code of the first processor for errors.

FIG. 1A is a block diagram illustrating a non-volatile memory system. The non-volatile memory (NVM) system 100 includes a controller 102 and non-volatile memory that may be made up of one or more non-volatile memory die 104. As used herein, the term die refers to the set of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a flash memory controller) can take the form of processing circuitry, one or more microprocessors or processors (also referred to herein as central processing units (CPUs)), and a computer-readable medium that stores computer-readable program code (e.g., software or firmware) executable by the (micro)processors, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system.

Although in the example illustrated in FIG. 1A NVM system 100 includes a single channel between controller 102 and non-volatile memory die 104, the subject matter described herein is not limited to having a single memory channel. For example, in some NAND memory system architectures, such as in FIGS. 1B and 1C, 2, 4, 8 or more NAND channels may exist between the controller and the NAND memory device, depending on controller capabilities. In any of the embodiments described herein, more than a single channel may exist between the controller and the memory die, even if a single channel is shown in the drawings.

Figure 1B:
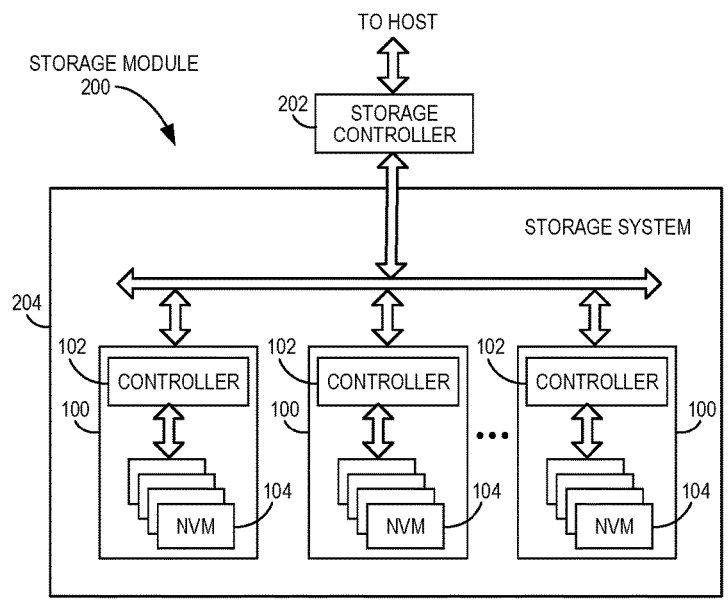
FIG. 1B is a block diagram illustrating an exemplary storage module.

FIG. 1B illustrates a storage module 200 that includes plural NVM systems 100. As such, storage module 200 may include a storage controller 202 that interfaces with a host and with storage system 204, which includes a plurality of NVM systems 100. The interface between storage controller 202 and NVM systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

Figure 1C:
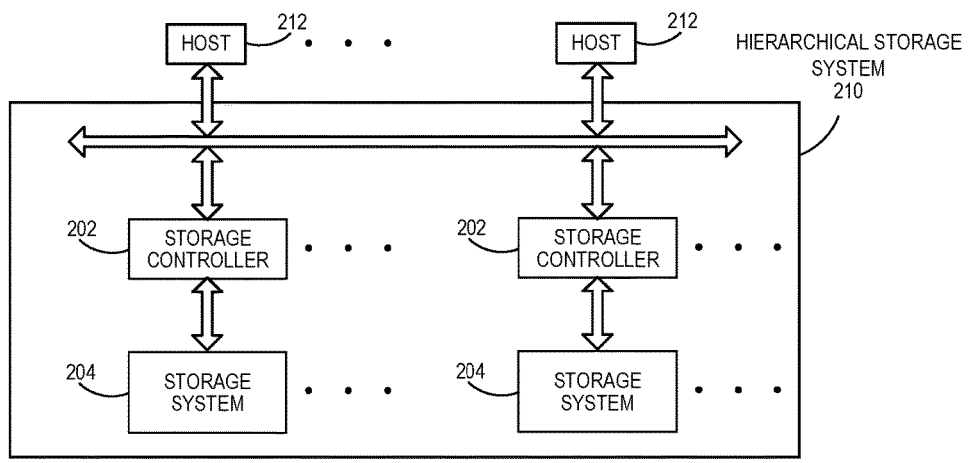
FIG. 1C is a block diagram illustrating a hierarchical storage system.

FIG. 1C is a block diagram illustrating a hierarchical storage system. A hierarchical storage system 210 includes a plurality of storage controllers 202, each of which controls a respective storage system 204. Host systems 212 may access memories within the hierarchical storage system via a bus interface. In one embodiment, the bus interface may be a non-volatile memory express (NVMe) or a fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
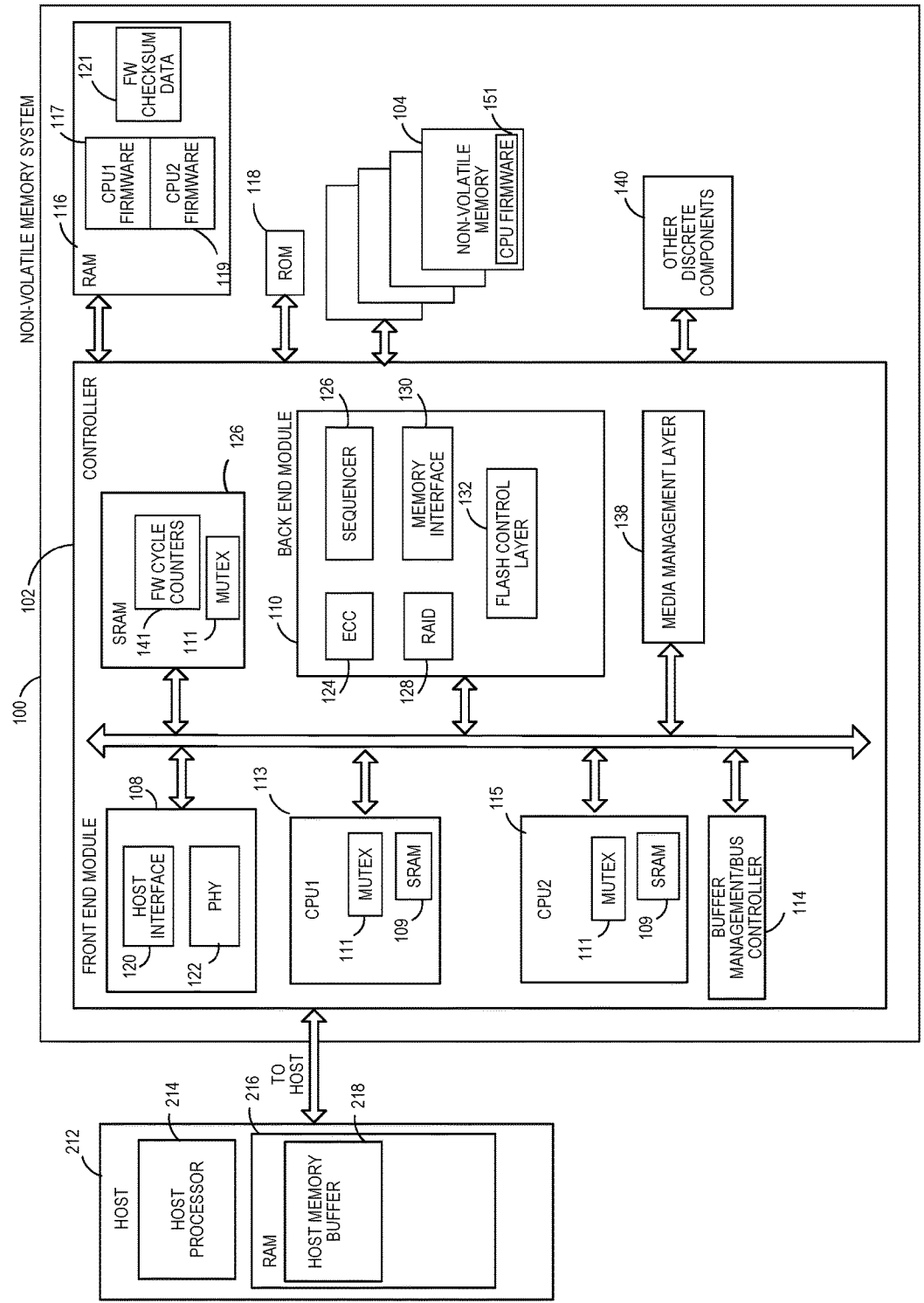
FIG. 2A is a block diagram illustrating exemplary components of a multi-processor controller of a non-volatile memory system.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Any separate processing engines that utilize a shared bus and execute firmware stored externally from the engines may be used in the system and method described herein. The processing engines, also referred to herein as processors, may be separate processing cores on a single application specific integrated circuit (ASIC), or may be completely discrete processors on different substrates. In one embodiment, as shown in FIG. 2A, the processors are hardware processors, such as central processing units (CPUs) CPU1 113 and CPU2 115, that may be part of or assigned to the front end module 108, the back end module 110 and the media management layer 138 (also referred to as the flash translation layer), respectively. Each of the CPUs 113, 115 may include a volatile memory component, such as static random access memory (SRAM) 109 and share a mutual exclusion object (mutex) 111 that allows one CPU to lock out another CPU ad keep that other CPU from carrying out an operation on a shared resource while the one CPU is carrying out its own particular operation on the resource. Although the mutex 111 is shown in each CPU 113, 115 and in shared SRAM 126, the mutex may actually be an object that may only be held by one CPU at a time and then returned to the shared SRAM 126 when not needed by a CPU.

Figure 2B:
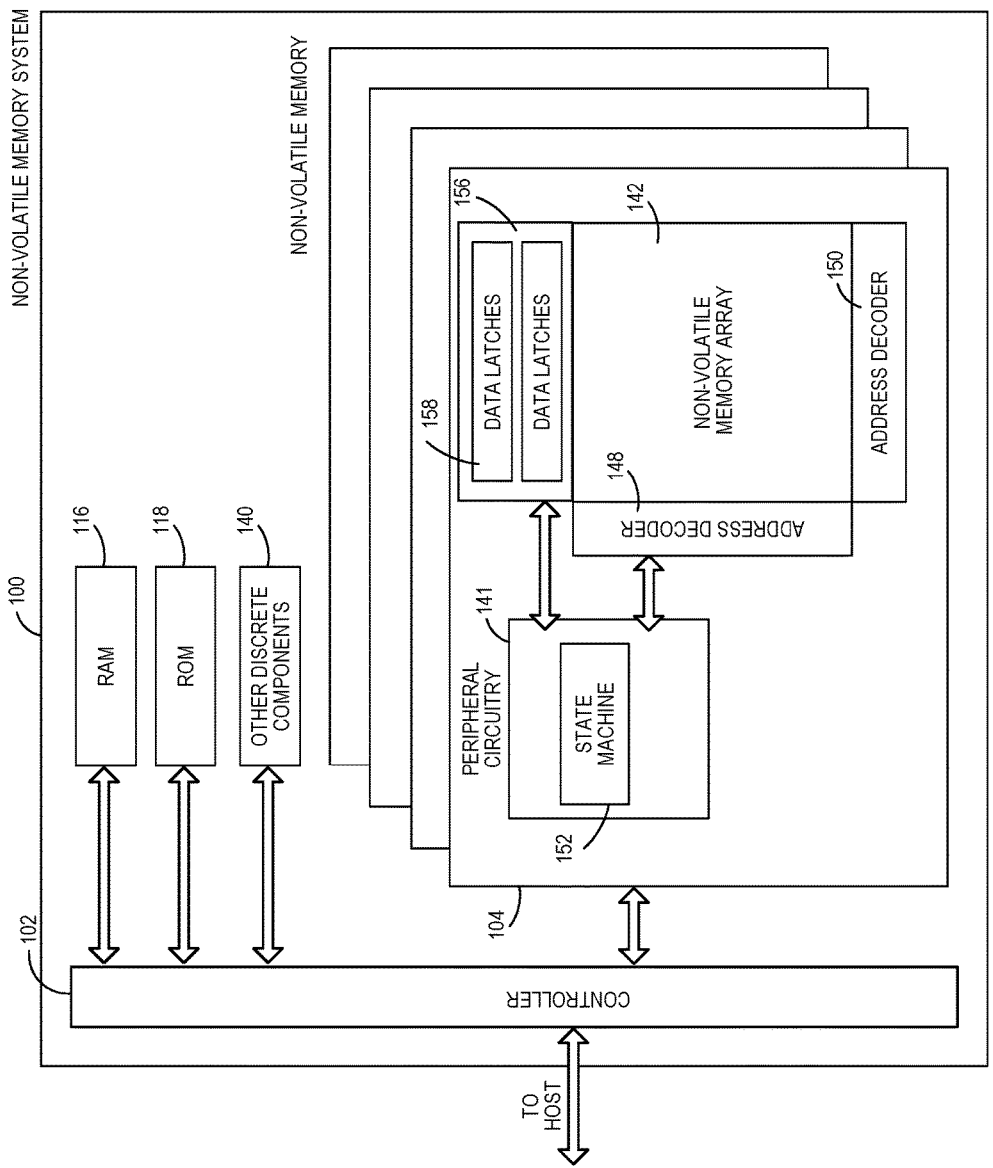
FIG. 2B is a block diagram illustrating exemplary components of a non-volatile memory of a non-volatile memory storage system.

In one implementation CPU1 113 manages the host interface 120 and implements a command manager (CM) function that translates host commands received from a host into a format usable by the NVM system. CPU2 115 may manage the backend module 110, which may also be referred to as the physical storage layer (PS), and specifically manages read and write operations to and from the non-volatile memory. CPU2 115 may also manage the media management layer (MML) 138 and specifically read operations. The assignment of functions and responsibilities in the controller 102 to CPU1 113 and CPU2 115 described above is just one example and may differ in other implementations. Also, although two CPUs 113, 115 are illustrated in the example of FIG. 2B, any controller architecture having two or more CPUs dividing up the various functions of the controller 102 is contemplated.

Modules of the controller 102 may include firmware for protecting the firmware on each CPU. This firmware protection firmware may be part of each of the CPU1 and CPU2 firmware 117, 119 and provide functionality for managing the use of the multiple processors 113, 115, as described in greater detail below. For example, the firmware protection firmware may include code that implements a checksum algorithm such as the Adler-32 algorithm described in RFC 1950, the CRC-32 algorithm described in the IEEE 802 specification and used in the SATA protocol, or any other algorithm commonly used for determining data integrity. The firmware protection instructions may also include more advanced error correction algorithms such as a Hamming code.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller 102. In yet other embodiments, portions of RAM 116 and ROM 118 may be located both within the controller 102 and outside the controller. Further, in some implementations, the controller 102, RAM 116, and ROM 118 may be located on separate semiconductor die.

The RAM 116 may be dynamic random access memory (DRAM) and be used as a cache for various types of data. As described in greater detail below, the RAM 116 in the NVM system, whether outside the controller 102, inside the controller or present both outside and inside the controller 102, may include a portion having a copy of the data used by each CPU 113, 115 to execute their respective tasks. This portion of the RAM is used to hold a copy of the processor executable instructions, also referred to herein as firmware, for each of the CPUs 113, 115. The original version of the CPU1 firmware 117 and CPU2 firmware 119 may be stored in the non-volatile memory 104 (CPU firmware 151) and when the NVM system 100 is connected to a host, the CPU1 firmware 117 and CPU2 firmware 119 copies are written to RAM 116 along with firmware integrity data, for example firmware checksum data 121. The CPU1 and CPU2 firmware 117, 119 copies in RAM 116 may be referred to as images and may be arranged contiguously in the RAM 116, where each of the images of the CPU1 firmware and CPU2 firmware are separate groups of data and firmware for each respective CPU. Another portion of the RAM 116 may also be reserved for a host data buffer (not shown) buffering host data being written to the non-volatile memory 104 and data being read from the non-volatile memory 104. Yet another portion of the RAM 116 may be assigned to holding one or more mapping tables (not shown) for logical-to-physical address mapping and so on.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the NVM system 100. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

Additional components of NVM system 100 illustrated in FIG. 2A include the media management layer 138, which performs wear leveling of memory cells of non-volatile memory die 104 and manages mapping tables and logical-to-physical mapping or reading tasks. NVM system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

FIG. 2A also illustrates an example of a host system 212 that may be used with the NVM system 100. The host system 212 may include a host processor 214 and memory such a volatile and/or non-volatile memory. An example of volatile memory, RAM 216 is shown in this example. Furthermore, the host 212 may dedicate a portion of it memory to a host memory buffer 218 that is actually memory on the host 212 dedicated by the host processor 214 to use and access by the CPUs 113, 115 in the NVM system. As described in later embodiments, the host memory buffer 218 may be used by the CPUs 113, 115, instead of or addition to RAM 116 on the NVM system 100, for storing some or all of the CPU firmware 117, 119 or other data used by the NVM system 100.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or a three dimensional configuration. As an example of the arrangement of the non-volatile memory cells, the memory cells may be arranged in minimum units of erase referred to as blocks, where each block is composed of a predetermined number of pages and each page is composed of a predetermined number of bits. Peripheral circuitry 141 includes a state machine 152 that provides status information to controller 102. Non-volatile memory die 104 further includes a data cache 156 that caches data being read from or programmed into the non-volatile memory cells of the non-volatile memory array 142. The data cache 156 comprises sets of data latches 158 for each bit of data in a memory page of the non-volatile memory array 142. Thus, each set of data latches 158 may be a page in width and a plurality of sets of data latches 158 may be included in the data cache 156. For example, for a non-volatile memory array 142 arranged to store n bits per page, each set of data latches 158 may include n data latches where each data latch can store 1 bit of data.

In one implementation, an individual data latch may be a circuit that has two stable states and can store 1 bit of data, such as a set/reset, or SR, latch constructed from NAND gates. The data latches 158 may function as a type of volatile memory that only retains data while powered on. Any of a number of known types of data latch circuits may be used for the data latches in each set of data latches 158. Each non-volatile memory die 104 may have its own sets of data latches 158 and a non-volatile memory array 142. Peripheral circuitry 141 includes a state machine 152 that provides status information to controller 102. Peripheral circuitry 141 may also include additional input/output circuitry that may be used by the controller 102 to transfer data to and from the latches 158, as well as an array of sense modules operating in parallel to sense the current in each non-volatile memory cell of a page of memory cells in the non-volatile memory array 142. Each sense module may include a sense amplifier to detect whether a conduction current of a memory cell in communication with a respective sense module is above or below a reference level.

Referring now to FIG. 3, a process of protecting the integrity of firmware for the processors 113, 115 in the NVM system 100 is described. As noted above, in a multi-processor non-volatile memory system that does not include a dedicated error correction code (ECC) engine for real-time checking and correction of errors in respective firmware that is retrieved from cache memory and executed by the multiple processors, transient bit flips in the cached firmware may develop over time and cause problems. These transient bit flips, in such a multi-processor system, can cause problems because the firmware code for a particular CPU will be retrieved and executed by the particular processor without any integrity check for errors. As shown in FIG. 3, one process for compensating for potential bit flips in the firmware involves each processor (CPU1 113 and CPU2 115), when it is otherwise idle, checking to see whether the other processor's firmware in RAM 116 has been corrupted (at 302). The CPU that is having its firmware checked in RAM 116 need not be idle, only the CPU performing the integrity check. As used herein, the idle state for a CPU refers to a time period where no host command requiring use of the particular processor's resources is pending, no internal process of the storage device is executing that requires the resources of this particular CPU, and the CPU is not in a low-power or powered-down state (for example no host read or write operations are pending that require processing on the particular CPU).

If a first CPU is idle, then the first CPU retrieves a portion of the second CPU's firmware in the volatile memory cache, for example from RAM 116, and checks the integrity of that retrieved portion of the second CPU's firmware (at 304, 306). The amount of firmware retrieved from RAM 116 for each iteration may be a page of data and the page of data may be a fixed predetermined number of bits selected to optimize the efficiency of a CPU in reviewing the firmware of the another CPU. Although iterative retrieval and integrity checking of fixed page sizes of firmware during CPU idle times are discussed, it is also contemplated that a variable page size or other portion size may be used for other idle time retrieval and integrity checking of one CPU's firmware by another CPU in different implementations.

If the integrity check of the retrieved page in RAM 116 of the other CPU's firmware reveals no errors, the first CPU's counter/pointer to the current position in the second CPU's code in the RAM 116 is updated to a next position (at 308, 310). If the first CPU's counter/pointer has reached the end of the second CPU's firmware in the RAM 116, then the first CPU counter/pointer is reset to the beginning of the firmware and the first CPU starts working again through the second CPU's firmware in RAM 116 from the initial starting position (at 312, 314). If the counter/pointer has not reached the end of the second CPU's firmware in RAM 116, then the process continues (at 312).

The process of the first CPU checking the integrity of the firmware of the second CPU repeats in this fashion until the first CPU is no longer idle or an error is discovered. When an error is detected in the second CPU's firmware by the first CPU (at 308), then the first processor may replace the corrupted page of the firmware of the second processor in RAM 116 with a corrected page. In one implementation, the first processor may retrieve a copy of the original page from non-volatile memory 104 in the NVM system 100 (at 316) and replace the corrupted page found in RAM 116 with the retrieved copy from non-volatile memory 104 (at 318). To avoid the possibility of the second processor trying to access the corrupted firmware while the first processor is writing the corrected page, the first processor may activate the mutex to prevent the second processor from attempting to access that page of, or in alternative embodiments any page of, firmware. After replacing the corrupted page of firmware, the page counter/pointer for the first processor increments and the firmware checking process continues (at 310) as described above.

The process of FIG. 3 may be executed concurrently by the second processor on the first processor's firmware in RAM 116. In other words, in one implementation, if both the first and second CPUs are idle, then each processor can concurrently check the firmware of the other CPU in RAM 116. The process of one processor checking the other's firmware in RAM 116 for the other CPU may occur independently but concurrently or only one CPU at a time may be checking the other CPU's firmware, depending on the idle status of the processors at any given time. For example, while both CPU1 113 and CPU2 115 are idle, CPU1 113 may iteratively check CPU2's firmware 119 in RAM 116 and vice versa. If CPU1 113 is active with a host I/O related command, then CPU1 113 stops checking CPU2's firmware 117, but keeps track of where in CPU2's firmware 117 it is using a counter or pointer, as described below, so that CPU1 115 may continue from where it left off in CPU2's firmware 117 when CPU1 113 becomes idle again. Also, even though CPU1 113 is active and the CPU2 firmware 117 temporarily cannot be checked by CPU1 113, CPU2 115 can still continue checking CPU1 firmware 119. The flow chart of FIG. 3 is presented from only one processor's perspective to simplify the discussion above, however the first processor may be concurrently executing the same process on the second processor's firmware, or each of more than two processors may be concurrently executing this process on each other's firmware in NVM systems with more than two processors.

In order to check the integrity of the firmware page that is retrieved in the process of FIG. 3, one of any number of integrity checking mechanisms maybe used by the processor doing the integrity checking. In one implementation, the integrity check may be a parity check of one or more bits generated by a CPU for a retrieved page of firmware of the other CPU and compared to a previously generated parity bit or bits for the current page. The parity information may be as simple as a single bit parity that indicates whether the page of firmware retrieved from RAM 116 has the expected number of 1's or 0's, or may be a multi-bit parity check providing greater accuracy and information regarding flipped bit errors. The previously stored parity information may be stored elsewhere in RAM 116, in shared volatile memory between the CPUs, such as SRAM 126 (FIG. 2A), or may be stored with the associated firmware page itself.

Alternatively, the integrity check of each page in RAM 116 may be a checksum mechanism. The checksum algorithm may be a cyclic redundancy check (CRC) checksum algorithm or something more sophisticated such as a Hamming code checksum algorithm. As with the parity version noted above, an integrity check using a checksum algorithm includes one CPU taking the page of the other CPU's firmware, generating checksum information for the retrieved page and comparing that to previously generated checksum information 121 (FIG. 2A) that may be stored in shared SRAM 126. Any of a number of integrity check mechanisms, such as parity or checksum algorithms may be implemented to perform the integrity check. Also the location of the previously generated checksum or parity information need not be in a separate SRAM 126 location away from the firmware and may be included in the RAM 116 with the firmware or in other memory locations accessible for the CPUs 113, 115.

In yet other alternative implementations, the process of steps 316 and 318 in FIG. 3, where an error is corrected in the RAM 116 copy by retrieving a clean copy from non-volatile memory 104 and replacing the corrupted version in flash with the original page, may be replaced with error correction performed on the corrupted page. Using a more sophisticated algorithm, such as a Hamming code checksum algorithm, a CPU performing the integrity check may actually correct the specific error detected in the retrieved firmware page of the other CPU, and then store that corrected page back in RAM 116, rather than simply identifying that an error is present and retrieving the original page from non-volatile memory 104 for subsequently storing in RAM 116. It is contemplated that, once the error in the firmware is discovered, the mutex software 111 may be utilized by the CPU engaged in correcting the other CPU's firmware to prevent that other CPU from attempting to access the firmware during the correction and replacement process.

Figure 4:
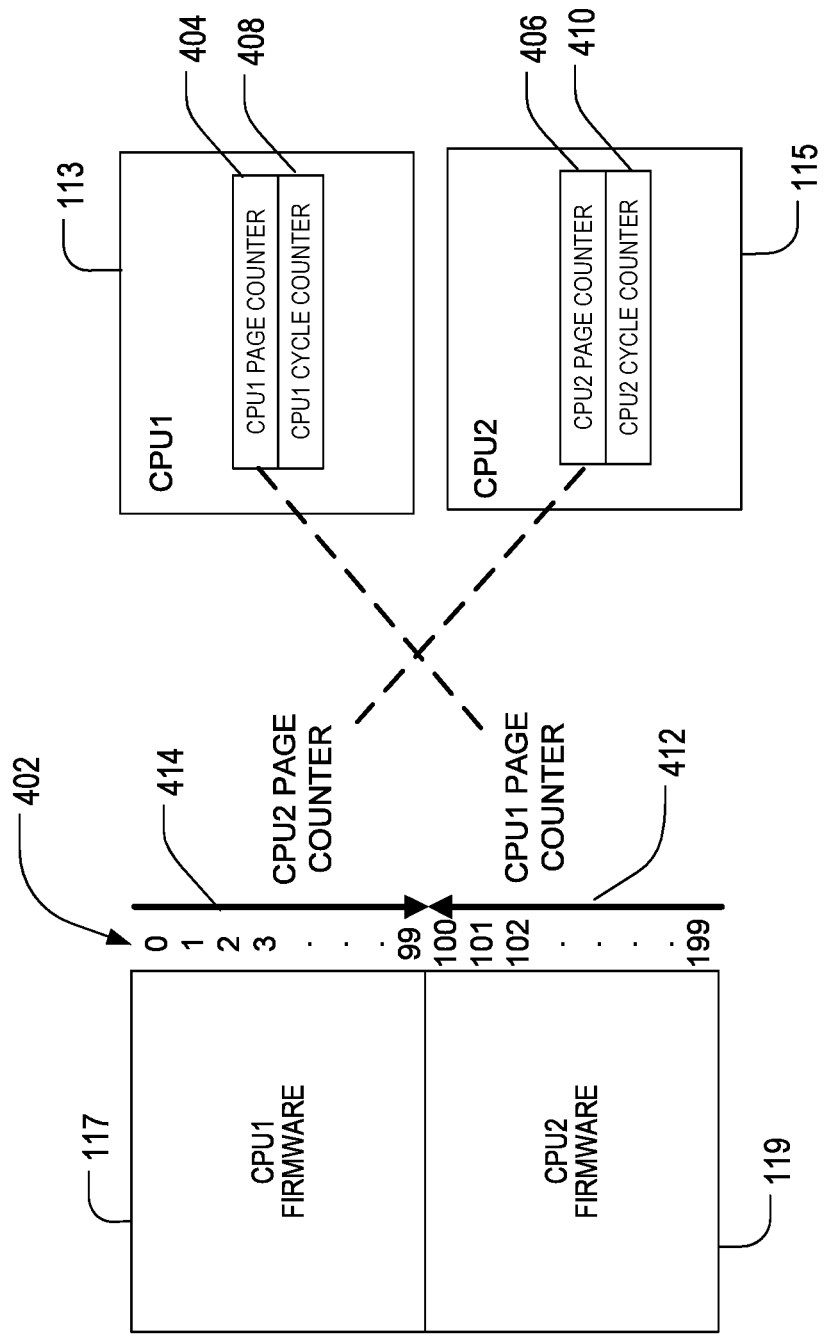
FIG. 4 a simplified illustration of the system of FIGS. 2A and 2B implementing the process of FIG. 3.

FIG. 4 illustrates one implementation of the use of page and cycle counters in the NVM system 100 to allow each CPU 113, 115 to work its way through the firmware image of the other CPU in DRAM to check the firmware integrity of the other CPU. Each CPU 113, 115 has access to the address range 402 of the firmware images (CPU1 firmware 117 and CPU2 firmware 119) in RAM 116 and each CPU 113, 115 may have both a page counter 404, 406 that tracks the particular page in the range 402 in RAM 116 that each CPU is currently at in the firmware integrity check process of FIG. 3. The address range 402 includes a starting address of 0 and a maximum address of 199 in this example, but any other range having starting and ending addresses for a contiguous firmware address space in RAM 116 may be used in other implementations. In one implementation, the firmware space for each CPU is contiguous and checked by a different CPU. It can also be non-contiguous. For implementations where the CPU firmware is non-contiguous, for example separated by pockets of user data or mapping date that also resides in RAM, the NVM system 100 may maintain a page table for each CPU to determine which of the data is CPU firmware and which CPU is associated with the firmware. Thus, although the CPU1 firmware 117 and CPU2 firmware 119 are shown as immediately adjacent one another at consecutive RAM address locations in FIG. 4, in other implementations, the firmware space in RAM 116 may be broken up by other data.

FIG. 4 illustrates a simplified view of the NVM system 100 of FIGS. 2A-2B to better illustrate the process set out in FIG. 3. In the two CPU example of FIG. 4, where the CPU1 firmware 117 is located at the beginning of the address range 402 and CPU2 firmware 119 is at the end of the range 402, CPU1 113 is configured to start its page counter 404 at the end of the range (e.g. page 199 in this example) and every update to the CPU1 page counter 404 decrements the page counter by 1 as it works through the CPU2 firmware 119. This decreasing counter process for CPU1's page counter 404 is illustrated graphically by arrow 412. Conversely, the CPU2 page counter 406 used by CPU2 115 to track where it is in the review of CPU1 firmware 117 starts at page 0 in the DRAM and every counter update increases the CPU2 page counter 404 by 1 as indicated graphically by arrow 414. The timing for updating the respective page counter 404, 406 for each CPU 113, 115 may be implemented using the method of FIG. 3 which, as described above, may be executing in parallel on both CPUs 113, 115.

When a CPU has sequentially checked all of the firmware pages for the other CPU, a cycle is complete and the CPU cycle counter 408, 410 for the respective CPU that has finished a firmware check cycle of all the pages of the other CPUs firmware in DRAM is then incremented. With the outside-in approach to the counter updates for CPU1 and CPU2 113, 115, the logic for determining when a processor has finished a cycle of the other CPUs firmware may be as follows: in the context of CPU1 which is checking CPU2 firmware, if CPU1 page counter 404 is less than or equal to (<=) CPU2 page counter 406, then the CPU1 cycle counter 408 is updated and the CPU1 page counter 404 is reset to the initial maximum value (here, 199). In the context of CPU2 which is checking CPU1 firmware, if the CPU2 counter is greater than or equal to (>=) the CPU1 page counter 404 then the CPU 2 cycle counter is updated by CPU2 and the CPU2 page counter is reset to the initial minimum value (here, 0).

Figure 5:
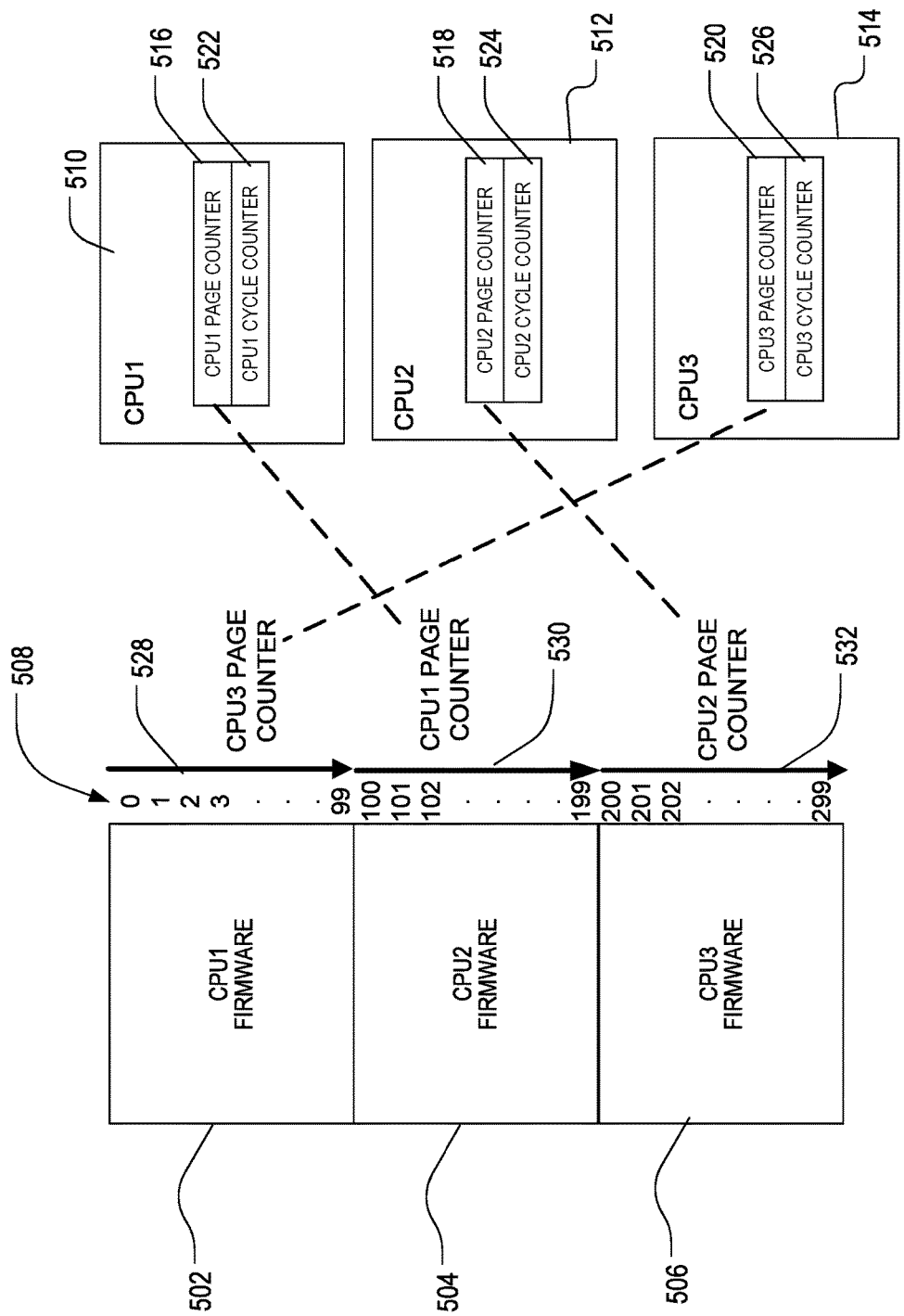
FIG. 5 illustrates an alternative embodiment of the system of FIG. 4 with more than two processors.

In other embodiments, the CPUs 113, 115 may have access to the location of the firmware. For example, the start address and length of the firmware may be found in a header of each firmware image (e.g. the header of CPU1 firmware and CPU2 firmware). Alternatively, if the partitioning in RAM 116 is dynamic, the start address and length information may be stored in shared SRAM 126 or in RAM 116 for each firmware listing so that each CPU may start from the lowest address for the respective other CPU's firmware in RAM and work in the same direction to the highest address for the respective other CPU's firmware. Thus, instead of converging at a middle address from opposite ends of the total address range 402 in RAM 116 and looking for an intersection or overlap of the CPU page counters before incrementing a cycle counter 408, 410 for each CPU 113, 115, each CPU may move through the firmware for the other CPU in the same direction during the firmware integrity check process. Also, while the examples above discuss a two processor multi-processor NVM system 100, any number of two or more processors may be used, where each processor checks the integrity of the firmware of a different one of the other processors. The cycle counters 408, 410 may be stored on each respective CPU 113, 115 in local SRAM 109 or in a shared memory location 141 in shared SRAM 126. The cycle counters 408, 410 may be used for diagnostic purposes to see how often and how efficiently the CPU firmware 117, 119 is being fully reviewed in the process described herein Referring to FIG. 5, a simplified view of the example NVM system 100 of FIGS. 2A-2B is shown that is similar to the example of FIG. 4, but with a third processor (CPU3 514) and associated third firmware image (CPU3 firmware 506) in RAM added. In this example, the three CPUs (CPU1 510, CPU2 512 and CPU3 514) each are shown with respective page counters 516, 518, 520 and cycle counters 522, 524, 526. Each CPU 510, 512, 514 is configured to perform an integrity check of the firmware in RAM of another CPU, while that other CPU is idle, as described with respect to FIG. 3. However, the page counters 516, 518, 520 each are shown to increment from a lowest page location in RAM to a highest page location in RAM of the respective firmware being checked, rather than a converging firmware address checking process such as shown in the incrementing counter of one CPU and decrementing counter of another CPU in FIG. 4.

Referring again to FIG. 2B, there may be arrangements where, instead of a copy of the CPU firmware 117, 119 being maintained in RAM 116 or other volatile memory cache in the NVM system 100, a host memory buffer 218 (FIG. 2A) of volatile memory 216 located on the host 212 holds the cached copy of the CPU firmware 117, 119. As illustrated in FIG. 6, a method for protecting firmware residing in a cache on a host 212 rather than a cache within the NVM memory system 100 is described. In similar fashion to the embodiment of FIG. 3, when a first CPU in the NVM system 100 is in an idle state, it may retrieve and check the integrity of firmware cached in volatile memory for the second CPU, and vice-versa. Thus, when the first CPU is otherwise in an idle state it retrieves a page of the firmware for the second CPU from the host memory buffer 218 on the host 212 (at 602, 604). Although the host memory buffer 218 may store data using a page size (hereinafter host page) that differs from the page size utilized in the NVM system 100 (hereinafter device page), the page retrieved is a device page sized page size because the device page size corresponds to the amount of data for which the checksum or other ECC data was calculated for in the NVM system 100.

As before, the first CPU generates a checksum or other ECC data for the retrieved page and compares that generated value to previously stored checksum or other ECC value associated with the page to determine if they match. If there is a match, then no error has been detected (at 606). If the retrieved page is not the last page of the second CPU's firmware, then the first CPU's counter/pointer is updated (incremented or decremented depending on the direction in the host memory buffer address space it is scanning) and the process repeats for the next page while the first processor is still idle (at 608, 610, 602, 604). If the last page of the second CPUs firmware has been retrieved by the first CPU, then the firmware counter/pointer for the first CPU is reset. If the first CPU is idle it retrieves the first page of the second CPU's firmware in the host memory buffer 218 and continues the firmware checking process (at 608, 612, 602, 606).

At any time that an error is detected in due to a mismatch in the checksum data (or other ECC data being utilized), then the first CPU searches the host memory buffer for the header information of the host page at or before the retrieved device-sized with the detected checksum error. The header information for the host page that includes the retrieved device-sized page may the first N bytes of the host page at or before the retrieved device-sized page. As a simplified example, if the device page-size chunks taken by the first CPU from the host memory buffer are in 4 Kbyte increments and the host page size is 8 Kbyte, then the first CPU would look for the header region in the currently retrieved device page-sized of firmware for the second CPU in the host memory buffer with the detected error as well as the prior 4 Kbyte portion of the host memory buffer 218 in case the retrieved portion with the determined error was the second half of the host-size page and not the first half with the header (at 614). Once the header region is located, the first CPU examines the first N bytes of that region to see if source identifying information on the source of the program or operating system that last wrote to the memory location in the host memory buffer is identifiable. In one implementation, the identifying information may be pool header information, such pool header information formatted according the Microsoft WINDOWS pool structure.

If the first CPU can recognize the pool header (at 616), for example by comparison to one or more predetermined pool header formats, then the first CPU may read the pool tag in the pool header identifying the source of the data written to the host memory buffer and transmit that data to the host processor 214 along with the physical offset in the host page of the corruption (at 618, 620). If the first CPU does not recognize a pool header in the first N bytes, then the first CPU will continue retrieving and testing the device page-sized segments of the second CPU's firmware until an uncorrupted segment is reached (at 616, 622). The first CPU may then report the corrupted range of addresses in the host memory buffer 218 (at 624). Because the reasons for an error detected in the host memory buffer 218 on the host 212 may not only be due to a hardware bit flip issue, but may alternatively be caused by the host accidentally repurposing the host memory that should be dedicated for NVM system or be caused by stray pointer of the host operating system accidentally being written to the host memory buffer space, the CPUs 113, 115 of the NVM system 100 can assist the host 212 in preventing an error in future with the additional pool identifier information discussed in the process of FIG. 6.

After reporting to the host processor 214 either the pool tag and physical offset information, or reporting the corrupted range, the first CPU of the NVM system 100 may retrieve the one or more device page-size segments from non-volatile memory corresponding to the corrupted host pages and replace the corrupted host pages with the original second CPU firmware that should be stored in those locations in the host memory buffer 218 (at 620). It should be understood that, because any corrupt portion of a host page makes the entire host page corrupt and a host page may be greater than a device page-sized segment being examined, both the original device page for the detected device page-sized segment and any additional uncorrupted device page-size segment that complete the host page stored in the host memory buffer may be retrieved and sent to the host for replacing the corrupted host page.

In the present application, semiconductor memory devices such as those described in the present application may include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

Methods and systems have been disclosed for implementing a multi-processor controller architecture without the need for including a dedicated or real-time ECC engine in the data path for firmware between the volatile memory cache holding a copy of the firmware for the processors and the processors. Instead, the disclosed method and system utilize a cross-checking technique where each processor, when idle, checks the integrity of the firmware in the volatile memory cache for another processor.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A method of managing transient errors in firmware in a multi-processor non-volatile memory (NVM) system, the NVM system having a first processor configured to execute a first portion of NVM system operations and a second processor configured to execute a second portion of NVM system operations different than the first portion of NVM system operations, the method comprising:

in response to a first processor in the NVM system entering a first state corresponding to a time period where no host command is pending for the first processor:

in the first state, the first processor retrieving executable instructions of the second processor stored in a volatile memory;

in the first state, the first processor verifying integrity of the retrieved executable instructions of the second processor; and the first processor, in response to detecting an error in the retrieved executable instructions of the second processor, retrieving original executable instructions of the second processor from a non-volatile memory in the NVM system and replacing the executable instructions of the second processor in the volatile memory with the original executable instructions of the second processor.

2. The method of claim 1, wherein the executable instructions of the second processor comprise a plurality of predetermined portions and wherein the first processor retrieving and verifying the integrity of the retrieved executable instructions of the second processor comprises the first processor:

sequentially, for each of the plurality of predetermined portions, retrieving a respective one of the plurality of portions and verifying the integrity of the respective one of the plurality of portions before retrieving and verifying a next respective one of the plurality of portions.

3. The method of claim 1, wherein the first processor verifying integrity of the retrieved executable instructions of the second processor comprises the first processor generating parity information for the retrieved executable instructions of the second processor and determining whether the generated parity information matches previously stored parity information associated with the retrieved executable instructions.

4. The method of claim 1, wherein the first processor verifying integrity of the retrieved executable instructions of the second processor comprises the first processor generating checksum information for the retrieved executable instructions of the second processor and determining whether the generated checksum information matches previously stored checksum information associated with the retrieved executable instructions.

5. The method of claim 4, further comprising retrieving the previously stored checksum information from a volatile memory separate from the volatile memory containing the retrieved executable instructions.

6. A multi-processor non-volatile memory (NVM) system comprising:

a non-volatile memory having a plurality of non-volatile memory cells;

a first processor in communication with the non-volatile memory;

a second processor in communication with the non-volatile memory;

a volatile memory configured to hold executable instructions of the first processor in the volatile memory, and configured to hold executable instructions of the second processor in the volatile memory; and wherein the first processor, during a first state of the first processor, is configured to check for errors in the executable instructions of the second processor in the volatile memory, wherein the first state of the first processor comprises a time period where no host command is pending for the first processor;

wherein the second processor, during a second state of the second processor, is configured to check for errors in the executable instructions of the first processor in the volatile memory, wherein the second state of the second processor comprises a time period where no host command is pending for the second processor; and wherein the first processor is further configured to, in response to identifying an error in the executable instructions of the second processor held in the volatile memory, replace the executable instructions of the second processor held in the volatile memory with a copy of the executable instructions of the second processor retrieved from the non-volatile memory.

7. The multi-processor NVM system of claim 6, wherein when the first processor and the second processor are in the first state and the second state, respectively, the first processor is configured to check for errors in the executable instructions of the second processor in the volatile memory concurrently with the second processor checking for errors in the executable instructions of the first processor in the volatile memory.

8. The multi-processor NVM system of claim 7, further comprising:

the second processor further configured to, in response to identifying an error in the executable instructions of the first processor held in the volatile memory, apply an error correction algorithm to the executable instructions of the first processor, correct the identified error in the executable instructions of the first processor to generate corrected executable instructions and replace the executable instructions of the first processor in the volatile memory with the corrected executable instructions.

9. The multi-processor NVM system of claim 7, wherein:

to check for errors in the executable instructions of the second processor, the first processor is configured to retrieve one portion of a plurality of portions of the executable instructions of the second processor from the volatile memory and check for any errors in the one portion before retrieving a next portion of the plurality of portions from the volatile memory and checking the next portion for any errors.

10. The multi-processor NVM system of claim 9, wherein to check for any errors in a respective portion of the plurality of portions, the first processor is configured to generate checksum data for the respective portion and compare the generated checksum data with previously stored checksum data for the respective portion.

11. The multi-processor NVM system of claim 10, wherein the non-volatile memory comprises a substrate formed with a three-dimensional memory structure.

12. The multi-processor NVM system of claim 9, wherein the first processor further comprises a first cycle counter and a first portion pointer and wherein the first processor is configured to:

after checking for errors in a respective portion of the plurality of portions, update the first portion pointer to point to the respective portion, wherein the first portion pointer only points to a portion most recently checked for errors by the first processor; and increment the first cycle counter each time all the plurality of portions of the executable instructions of the second processor has been checked by the first processor.

13. The multi-processor NVM system of claim 9, wherein each of the plurality of portions comprises a physical page of memory.

14. The multi-processor NVM system of claim 6, wherein the volatile memory comprises random access memory (RAM).

15. The multi-processor NVM system of claim 6, wherein the volatile memory is located within the NVM system.

16. The multi-processor NVM system of claim 6, wherein the volatile memory is a host memory buffer located in a host outside of the multi-processor NVM system.

17. The multi-processor NVM system of claim 16, wherein when the first processor detects an error in the executable instructions of the second processor stored in the host memory buffer, the first processor is configured to transmit a message to the host identifying a location of the detected error in the host memory buffer.

18. A method for managing errors in processor executable code stored in a volatile memory of a multi-processor non-volatile memory (NVM) system, the method comprising:

when a first processor of the multi-processor NVM system is operating on a host command, the first processor retrieving and executing executable code of the first processor from the volatile memory without first checking the executable code of the first processor for errors;

when a second processor of the multi-processor NVM system is operating on the host command, the second processor retrieving and executing executable code of the second processor from the volatile memory without first checking the executable code of the second processor for errors;

while the first processor is in a first state corresponding to a time period where no host command is pending for the first processor, the first processor retrieving the executable code for the second processor from the volatile memory and checking the executable code of the second processor for errors; and while the second processor is in a second state corresponding to a time period where no host command is pending for the second processor, the second processor retrieving the executable code for the first processor from the volatile memory and checking the executable code of the first processor for errors; and wherein in response to the first processor identifying an error in the executable code of the second processor held in the volatile memory, the first processor replaces the executable code of the second processor held in the volatile memory with a copy of the executable code of the second processor retrieved from a non-volatile memory in the NVM system.

19. A non-volatile memory system comprising:

a non-volatile memory having a first set of processor executable code and a second set of processor executable code;

a volatile memory having a copy of the first set of processor executable code and a copy of the second set of processor executable code;

first processing means for retrieving from the volatile memory, and verifying integrity of, portions of the copy of the second set of processor executable code, and in response to identifying an error in the copy of the second set of processor executable code held in the volatile memory, replace the copy of the second set of processor executable code held in the volatile memory with another copy of the second set of processor executable code retrieved from the non-volatile memory, while the first processing means is in a first state wherein no host command is pending for the first processing means; and second processing means for retrieving from the volatile memory, and verifying integrity of, the first set of processor executable code while the second processing means is in a second state wherein no host command is pending for the second processing means.

\* \* \* \* \*